United States Patent
Kamisaka et al.

(10) Patent No.: US 12,463,138 B2
(45) Date of Patent: Nov. 4, 2025

(54) BIT LINE AND SOURCE LINE CONNECTIONS FOR A 3-DIMENSIONAL ARRAY OF MEMORY CIRCUITS

(71) Applicant: SUNRISE MEMORY CORPORATION, San Jose, CA (US)

(72) Inventors: Shohei Kamisaka, Kanagawa (JP); Yosuke Nosho, Tokyo (JP)

(73) Assignee: SUNRISE MEMORY CORPORATION, San Jose, CA (US)

( * ) Notice: Subject to any disclaimer, the term of this patent is extended or adjusted under 35 U.S.C. 154(b) by 815 days.

(21) Appl. No.: 17/548,034

(22) Filed: Dec. 10, 2021

(65) Prior Publication Data
US 2022/0199532 A1    Jun. 23, 2022

Related U.S. Application Data

(60) Provisional application No. 63/128,347, filed on Dec. 21, 2020.

(51) Int. Cl.
*H01L 23/535* (2006.01)
*H01L 21/768* (2006.01)
(Continued)

(52) U.S. Cl.
CPC ...... *H01L 23/535* (2013.01); *H01L 21/76805* (2013.01); *H01L 21/76831* (2013.01);
(Continued)

(58) Field of Classification Search
CPC ............. H01L 23/535; H01L 21/76805; H01L 21/76831; H01L 21/7684; H01L 21/76895;
(Continued)

(56) References Cited

U.S. PATENT DOCUMENTS 5,583,808 A    12/1996  Brahmbhatt
5,646,886 A     7/1997  Brahmbhatt
(Continued)

FOREIGN PATENT DOCUMENTS

KR    20120085591 A1    8/2012
WO     2018236937 A1   12/2018

OTHER PUBLICATIONS

"EP Extended Search Report EP168690149.3", Oct. 18, 2019.
(Continued)

*Primary Examiner* — Duy T Nguyen
*Assistant Examiner* — Pratiksha Jayant Lohakare

(57) ABSTRACT

A conductor-filled via formed between an interconnection conductor layer and a buried contact above a planar surface of a semiconductor substrate, includes: (a) a first portion that extends from the interconnection conductor layer through a first isolation layer to a step in a staircase structure formed above the buried contacts, wherein (i) the step of the staircase structure is aligned to the buried contact along a first direction substantially normal to the planar surface of the semiconductor substrate, (ii) at the top of the step, the step comprises a bit line layer, a source line layer and a second isolation layer between the bit line layer and the source line layer, and (iii) the first portion electrically contacting the layer at the top of the step; and (b) a second portion extending from a portion of the step below the layer at the top of the step to the buried contact, wherein a spacer insulator lines sidewalls of the conductor-filled via.

9 Claims, 15 Drawing Sheets

(51) Int. Cl.
*H01L 23/528* (2006.01)
*H01L 23/532* (2006.01)

(52) U.S. Cl.
CPC .... *H01L 21/7684* (2013.01); *H01L 21/76895* (2013.01); *H01L 23/5283* (2013.01); *H01L 23/53266* (2013.01); *H01L 23/53271* (2013.01); *H01L 23/5329* (2013.01)

(58) Field of Classification Search
CPC ........... H01L 23/5283; H01L 23/53266; H01L 23/53271; H01L 23/5329; H10B 43/50; H10B 43/10; H10B 43/27
USPC ........................................................ 257/774
See application file for complete search history.

(56) References Cited

U.S. PATENT DOCUMENTS

| | | |
|---|---|---|
| 5,656,842 A | 8/1997 | Iwamatsu |
| 5,768,192 A | 6/1998 | Eitan |
| 5,789,776 A | 8/1998 | Lancaster et al. |
| 5,915,167 A | 6/1999 | Leedy |
| 6,040,605 A | 3/2000 | Sano et al. |
| 6,107,133 A | 8/2000 | Furukawa |
| 6,118,171 A | 9/2000 | Davies et al. |
| 6,130,838 A | 10/2000 | Kim et al. |
| 6,313,518 B1 | 11/2001 | Ahn et al. |
| 6,362,508 B1 | 3/2002 | Rasovaky et al. |
| 6,434,053 B1 | 8/2002 | Fujiwara |
| 6,580,124 B1 | 6/2003 | Cleeves et al. |
| 6,744,094 B2 | 6/2004 | Forbes |
| 6,754,105 B1 | 6/2004 | Chang et al. |
| 6,774,458 B2 | 8/2004 | Fricke et al. |
| 6,873,004 B1 | 3/2005 | Han et al. |
| 6,946,703 B2 | 9/2005 | Ryu et al. |
| 7,005,350 B2 | 2/2006 | Walker et al. |
| 7,223,653 B2 | 5/2007 | Cheng et al. |
| 7,307,308 B2 | 12/2007 | Lee |
| 7,489,002 B2 | 2/2009 | Forbes et al. |
| 7,512,012 B2 | 3/2009 | Kuo |
| 7,524,725 B2 | 4/2009 | Chung |
| 7,612,411 B2 | 11/2009 | Walker |
| 8,026,521 B1 | 9/2011 | Or-Bach et al. |
| 8,139,418 B2 | 3/2012 | Carman |
| 8,178,396 B2 | 5/2012 | Sinha et al. |
| 8,278,183 B2 | 10/2012 | Lerner |
| 8,383,482 B2 | 2/2013 | Kim et al. |
| 8,436,414 B2 * | 5/2013 | Tanaka ................... H10D 30/69 257/324 |
| 8,630,114 B2 | 1/2014 | Lue |
| 8,743,612 B2 | 6/2014 | Choi et al. |
| 8,767,473 B2 | 7/2014 | Shim et al. |
| 8,848,425 B2 | 9/2014 | Schloss |
| 8,878,278 B2 * | 11/2014 | Alsmeier ............... H10B 43/27 257/314 |
| 9,190,293 B2 | 11/2015 | Wang et al. |
| 9,202,694 B2 | 12/2015 | Konevecki et al. |
| 9,230,985 B1 | 1/2016 | Wu et al. |
| 9,412,752 B1 | 8/2016 | Yeh et al. |
| 9,530,785 B1 * | 12/2016 | Koka ...................... H10B 41/27 |
| 9,589,979 B2 * | 3/2017 | Hong ..................... H10B 41/20 |
| 9,698,152 B2 | 7/2017 | Peri |
| 9,711,529 B2 | 7/2017 | Hu et al. |
| 9,748,172 B2 | 8/2017 | Takaki |
| 9,842,651 B2 * | 12/2017 | Harari ................... H10D 62/115 |
| 9,892,800 B2 | 2/2018 | Harari |
| 9,911,497 B1 | 3/2018 | Harari |
| 10,014,317 B2 | 7/2018 | Peng |
| 10,074,667 B1 | 9/2018 | Higashi |
| 10,096,364 B2 | 10/2018 | Harari |
| 10,121,553 B2 | 11/2018 | Harari |
| 10,157,780 B2 | 12/2018 | Wu et al. |
| 10,249,370 B2 | 4/2019 | Harari |
| 10,254,968 B1 | 4/2019 | Gazit et al. |
| 10,373,956 B2 | 8/2019 | Gupta et al. |
| 10,381,378 B1 | 8/2019 | Harari |
| 10,395,737 B2 | 8/2019 | Harari |
| 10,431,596 B2 | 10/2019 | Herner et al. |
| 10,475,812 B2 | 11/2019 | Harari |
| 10,622,377 B2 | 4/2020 | Harari et al. |
| 2001/0030340 A1 | 10/2001 | Fujiwara |
| 2001/0053092 A1 | 12/2001 | Kosaka et al. |
| 2002/0028541 A1 | 3/2002 | Lee et al. |
| 2002/0051378 A1 | 5/2002 | Ohsawa |
| 2002/0193484 A1 | 12/2002 | Albee |
| 2004/0214387 A1 | 10/2004 | Madurawe et al. |
| 2004/0246807 A1 | 12/2004 | Lee |
| 2004/0262681 A1 | 12/2004 | Masuoka et al. |
| 2004/0262772 A1 | 12/2004 | Ramanathan et al. |
| 2005/0128815 A1 | 6/2005 | Ishikawa et al. |
| 2005/0280061 A1 | 12/2005 | Lee |
| 2006/0155921 A1 | 7/2006 | Gorobets et al. |
| 2008/0160765 A1 | 7/2008 | Lee et al. |
| 2008/0239812 A1 | 10/2008 | Naofumi et al. |
| 2008/0266960 A1 | 10/2008 | Kuo |
| 2009/0057722 A1 | 3/2009 | Masuoka et al. |
| 2009/0157946 A1 | 6/2009 | Arya |
| 2009/0237996 A1 | 9/2009 | Kirsch et al. |
| 2009/0279360 A1 | 11/2009 | Peter et al. |
| 2009/0316487 A1 | 12/2009 | Lee et al. |
| 2010/0124116 A1 | 5/2010 | Takashi et al. |
| 2011/0115011 A1 | 5/2011 | Masuoka et al. |
| 2011/0208905 A1 | 8/2011 | Shaeffer et al. |
| 2011/0298013 A1 | 12/2011 | Hwang et al. |
| 2012/0182801 A1 | 7/2012 | Lue |
| 2012/0243314 A1 | 9/2012 | Takashi |
| 2012/0307568 A1 | 12/2012 | Banna et al. |
| 2013/0256780 A1 | 10/2013 | Kai et al. |
| 2014/0015036 A1 | 1/2014 | Fursin et al. |
| 2014/0040698 A1 | 2/2014 | Loh et al. |
| 2014/0117366 A1 | 5/2014 | Saitoh |
| 2014/0151774 A1 | 6/2014 | Rhie |
| 2014/0213032 A1 | 7/2014 | Kai et al. |
| 2014/0247674 A1 | 9/2014 | Karda et al. |
| 2014/0328128 A1 | 11/2014 | Louie et al. |
| 2014/0340952 A1 | 11/2014 | Ramaswamy et al. |
| 2015/0194440 A1 | 7/2015 | Noh et al. |
| 2015/0249143 A1 | 9/2015 | Sano |
| 2015/0340406 A1 * | 11/2015 | Jo ........................ H10N 70/841 257/4 |
| 2016/0019951 A1 | 1/2016 | Park et al. |
| 2016/0086970 A1 | 3/2016 | Peng |
| 2016/0141294 A1 | 5/2016 | Peri et al. |
| 2016/0141301 A1 | 5/2016 | Mokhlesi et al. |
| 2016/0211259 A1 | 7/2016 | Guo et al. |
| 2016/0225860 A1 | 8/2016 | Karda et al. |
| 2016/0314042 A1 | 10/2016 | Plants |
| 2017/0053906 A1 | 2/2017 | Or-Bach et al. |
| 2017/0062456 A1 * | 3/2017 | Sugino .................. H10B 43/10 |
| 2017/0092370 A1 | 3/2017 | Harari |
| 2017/0092371 A1 | 3/2017 | Harari |
| 2017/0148517 A1 | 5/2017 | Harari |
| 2017/0148810 A1 | 5/2017 | Kai et al. |
| 2017/0358594 A1 | 12/2017 | Lu et al. |
| 2018/0108416 A1 | 4/2018 | Harari |
| 2018/0158724 A1 | 6/2018 | Chang et al. |
| 2018/0269229 A1 | 9/2018 | Or-Bach et al. |
| 2018/0286678 A1 * | 10/2018 | Lee ..................... H01L 21/76831 |
| 2018/0342455 A1 | 11/2018 | Nosho et al. |
| 2018/0342544 A1 | 11/2018 | Lee et al. |
| 2018/0366471 A1 | 12/2018 | Harari et al. |
| 2018/0366485 A1 | 12/2018 | Harari |
| 2018/0366489 A1 * | 12/2018 | Harari ................. H01L 21/7682 |
| 2019/0006009 A1 | 1/2019 | Harari |
| 2019/0019564 A1 | 1/2019 | Li et al. |
| 2019/0157296 A1 | 5/2019 | Harari et al. |
| 2019/0180821 A1 | 6/2019 | Harari |
| 2019/0206890 A1 * | 7/2019 | Harari ............... H01L 21/76843 |
| 2019/0244971 A1 | 8/2019 | Harari |
| 2019/0259769 A1 | 8/2019 | Karda et al. |
| 2019/0319044 A1 | 10/2019 | Harari |
| 2019/0325964 A1 | 10/2019 | Harari |
| 2019/0348424 A1 | 11/2019 | Karda et al. |

(56) References Cited

U.S. PATENT DOCUMENTS

| | | | |
|---|---|---|---|
| 2019/0355747 A1 | 11/2019 | Herner et al. | |
| 2019/0370117 A1 | 12/2019 | Fruchtman et al. | |
| 2020/0020718 A1 | 1/2020 | Harari et al. | |
| 2020/0051990 A1 | 2/2020 | Harari et al. | |
| 2020/0098738 A1 | 3/2020 | Herner et al. | |
| 2020/0098779 A1 | 3/2020 | Cernea et al. | |
| 2020/0176468 A1* | 6/2020 | Herner | H10B 43/50 |
| 2020/0203378 A1 | 6/2020 | Harari et al. | |
| 2020/0203427 A1* | 6/2020 | Noh | H10B 43/10 |
| 2020/0219572 A1 | 7/2020 | Harari | |
| 2020/0258897 A1 | 8/2020 | Yan et al. | |

OTHER PUBLICATIONS

"European Search Report, EP 16852238.1", Mar. 28, 2019.
"European Search Report, EP17844550.8", Aug. 12, 2020, 11 pages.
"Notification of Reasons for Refusal, Japanese Patent Application 2018-527740", (English translation), Nov. 4, 2020, 8 pages.
"Partial European Search Report EP 16869049.3", Jul. 1, 2019, pp. 1-12.
"PCT Search Report and Written Opinion, PCT/US2018/038373", Sep. 10, 2018.
"PCT Search Report and Written Opinion, PCT/US2018/067338", May 8, 2019.
"PCT Search Report and Written Opinion, PCT/US2019/014319", Apr. 15, 2019.
"PCT Search Report and Written Opinion, PCT/US2019/041678", Oct. 9, 2019.
"PCT Search Report and Written Opinion, PCT/US2019/052446", Dec. 11, 2019.
"PCT Search Report and Written Opinion, PCT/US2020/065670", Apr. 5, 2021, 12 pages.
"PCT Search Report and Written Opinion, PCT/US2021/042607", Nov. 4, 2021, 17 pages.
"PCT Search Report and Written Opinion, PCT/US2021/42620", Oct. 28, 2021, 18 pages.
Kim, N., et al., "Multi-layered Vertical gate NANO Flash Overcoming Stacking Limit for Terabit Density Storage", Symposium on VLSI Tech. Dig. of Technical Papers, 2009, pp. 188-189.
Lue, H.T., et al., "A Highly Scalable 8-Layer 3D Vertical-gate {Vg} TFT NANO Flash Using Junction-Free Buried Channel BE-SONOS Device", Symposium on VLSI: Tech. Dig. of Technical Papers, 2010, pp. 131-132.
Tanaka, T., et al., "A 768 GB 3b/cell 3D-Floaling-Gate NANO Flash Memory", Digest of Technical Papers, the 2016 IEEE International Solid-Slate Circuits Conference, 2016, pp. 142-144.
Wann, H.C., et al., "High-Endurance Ultra-Thin Tunnel Oxide in Monos Device Structure for Dynamic Memory Application", IEEE Electron Device letters, vol. 16, No. 11, Nov. 1995, pp. 491-493.
"PCT Search Report and Written Opinion, PCT/US2021/062887", Feb. 24, 2022, 16 pages.

* cited by examiner

BIT LINE AND SOURCE LINE CONNECTIONS FOR A 3-DIMENSIONAL ARRAY OF MEMORY CIRCUITS

CROSS REFERENCE TO RELATED APPLICATIONS

The present application relates to and claims priority of U.S. provisional application ("Provisional Application"), Ser. No. 63/128,347, entitled "Bit Line And Source Line Connections For A 3-Dimensional Array of Memory Circuits," filed on Dec. 21, 2020. The disclosure of the Provisional Application is hereby incorporated by reference in its entirety.

The present application is also related to U.S. patent application ("Copending Application"), Ser. No. 16/914,089, entitled "Fabrication Method for a 3-Dimensional NOR Memory Array," filed on Jun. 26, 2020, which is a continuation of U.S. patent application Ser. No. 16/510,610, entitled "Fabrication Method for a 3-Dimensional NOR Memory Array," filed on Jul. 12, 2019, now U.S. Pat. No. 10,741,581, issued on Aug. 11, 2020. The disclosure of the Copending application is hereby incorporated by reference in its entirety.

BACKGROUND OF THE INVENTION

1. Field of the Invention

The present invention relates to semiconductor memory circuits. In particular, the present invention relates to providing via connecting for accessing bit lines and source lines of a 3-dimensional array of memory or storage transistors.

2. Discussion of the Related Art

The Copending Application discloses a staircase structure for accessing bit lines and source lines of a 3-dimensional array of horizontal NOR ("HNOR") memory strings. In that disclosure, the 3-dimensional array of HNOR memory strings comprises thin-film storage transistors formed above a planar surface of a semiconductor substrate. At or on the planar surface of the semiconductor substrate are formed various voltage sources, sense amplifiers and other circuitry suitable for use in HNOR memory string operations. In addition, multiple layers of interconnect conductors are provided both above and beneath the 3-dimensional array. The staircase structure allows a first type of via connections that provide access to bit lines or source lines of the HNOR memory strings of the 3-dimensional array at various steps of the staircase structure from a layer of the interconnect conductors provided above the 3-dimensional array. A second type of via connections allows access from that layer of interconnect conductors to the circuitry at or on the planar surface of the semiconductor substrate. Conductors in that layer of interconnect conductors may be used to interconnect the first and second types of via connections.

To further illustrate, FIG. 1(a) shows a top view (i.e., over an X-Y plane) of a staircase portion at an interconnect conductor layer above a 3-dimensional array of HNOR memory strings of the type disclosed in the Copending Application. For clarity and to facilitate the detailed description herein, a cartesian coordinate system is adopted in which the Z-direction represents the direction substantially normal to the semiconductor substrate and the X- and X-directions represent orthogonal directions in a plane substantially parallel the planar surface of the semiconductor substrate. In FIG. 1(a), via connections 104-1 to 104-4 represents metal-filled vias that provide connections between an interconnection conductor layer above the 3-dimensional array and an interconnection conductor layer beneath the 3-dimensional array (i.e., the second type of via connections). Via connections 103-1 to 103-4 represents metal-filled vias that provide connections between an interconnection conductor layer above the 3-dimensional array and various layers of bit lines that extend from the array portion (i.e., the portion of the 3-dimensional array at which the storage transistors of the HNOR memory strings are located). Via connections 103-1 to 103-4 belong therefore to the first type of via connections.

Conductors 102-1 to 102-4 are conductors in an interconnection conductor layer above the 3-dimensional array routing signals between via connections 103-1 to 103-4 and via connections 104-1 to 104-4, respectively.

FIG. 1(b) shows cross-sections 101-1 and 101-2, which are respectively X-Z plane cross sections along lines A-A' and B-B' annotated on FIG. 1(a). As shown in FIG. 1(b), cross-section 101-1 shows via-connections 103-1 to 103-4 extending from the interconnection conductor layer of FIG. 1(a) to the bit lines extended from the array portion of the 3-dimensional array. Cross-section 101-2 shows via connections extending from the interconnection conductor layer of FIG. 1(a) to an interconnection conductor layer beneath the 3-dimensional array. The interconnection conductor layer beneath the 3-dimensional array in FIG. 1(b) routes signals from the circuitry at or on the planar surface of the semiconductor substrate to via connections 104-1 to 104-4. FIG. 1(b) also shows via connections 105-1 to 105-4, which route signals from via connections 104-1 and 104-4, respectively, to other circuitry (e.g., circuitry at the periphery, such as an interface to an external circuit).

A similar signal routing scheme may be provided between the source lines of the 3-dimensional array and the circuitry at or on the planar surface of the semiconductor substrate.

The signal routing between the bit line and the circuitry at or on the planar surface of the semiconductor substrate, as illustrated in FIGS. 1(a) and 1(b), requires both silicon real estate (i.e., at least two via connections for each bit line at each step of the staircase). and conductors in at least one interconnection conductor layer. As known to those of ordinary skill in the art, both silicon real estate and conductors in interconnection conductor layers are precious resources in memory circuits. Any reduction in such resource requirements is highly desirable.

SUMMARY

According to one embodiment of the present invention, a process includes: (a) providing a one or more buried contacts above a planar surface of a semiconductor substrate; (b) creating a staircase structure in conjunction with a 3-dimensional array of memory cells formed above the buried contacts, the staircase structure comprising a plurality of steps, wherein (i) each step being aligned to one of the buried contacts along a first direction substantially normal to the planar surface; and (ii) at the top of each step, a plurality of layers, one on top of another, including, a bit line layer, a source line layer and a first isolation layer between the source line layer and the bit line layer, with either the bit line layer or the source line layer being closer to the top of each step than the other; (c) providing a second isolation layer over the staircase structure; (d) creating a trench at each step that extends along the first direction through the second isolation layer and the step to the buried contact; (e) depositing a spacer insulator in each trench and etching back the spacer insulator, so as to expose a portion of the layer at the top of each step and the buried contact and so that the spacer insulator lines sidewalls of the trench between the top of each step and the exposed buried contact; and (f) filling each trench with a conductor.

In some embodiments, the process further includes (a) planarizing the conductor-filled trench; (b) providing a third isolation layer over the conductor-filled trench; and (c) creating a via connection to allow access to the conductor-filled trench.

According to another embodiment of the present invention, a process includes (a) creating a staircase structure in conjunction with a 3-dimensional array of memory cells formed above a planar surface of a semiconductor substrate, the staircase structure comprising a plurality of steps, wherein at the top of each step, a plurality of layers, one on top of another, including, a source line layer at the top of each step; (b) providing a second isolation layer over the staircase structure; (c) creating a trench that extends along a first direction substantially normal to the planar surface through the second isolation layer, exposing source line layers at the top of multiple steps; (d) depositing a spacer insulator in the trench and etching back the spacer insulator, so as to expose the source line layers at the top of the steps; and (e) filling each trench with a conductor. In some embodiments, one or more buried contacts may be provided between the planar surface of a semiconductor substrate and the staircase structure, such that creating the trench and etching back the spacer insulator expose one of the buried contacts.

In some embodiments, the circuitry for memory cell operations is formed at or on the planar surface of the semiconductor substrate, and wherein the buried contacts are provided to connect to the circuitry.

According to one embodiment of the present invention, a conductor-filled via formed between an interconnection conductor layer and a buried contact above a planar surface of a semiconductor substrate, includes: (a) a first portion that extends from the interconnection conductor layer through a first isolation layer to a step in a staircase structure that is provided in conjunction with a 3-dimensional array of memory cells formed above the buried contacts, wherein (i) the step of the staircase structure is aligned to the buried contact along a first direction substantially normal to the planar surface of the semiconductor substrate, (ii) at the top of the step, the step comprises a plurality of layers, one on top of another, including, a bit line layer, a source line layer and a second isolation layer between the source line layer and the bit line layer, the bit line layer or the source line layer being the layer at the top of the step, and (iii) the first portion electrically contacting the layer at the top of the step; and (b) a second portion extending from a portion of the step below the layer at the top of the step to the buried contact, wherein a spacer insulator lines sidewalls of the conductor-filled via.

According to another embodiment of the present invention, a conductor-filled via is formed between one or more interconnection conductor layers and two or more steps of a staircase structure in conjunction with a 3-dimensional array of memory cells formed above a planar surface of a semiconductor substrate, wherein (i) the staircase structure comprises a plurality of steps, (ii) at the top of each step, a plurality of layers, one on top of another, including, a source line layer at the top of each step; and (iii) the conductor-filled via being formed inside a spacer insulator that exposes the source line layers at the top of the steps and which insulates the conductor-filled via from conductive layers in the two or more steps of the staircase structure.

The present invention is better understood upon consideration of the detailed description below, in conjunction with the accompanying drawings.

DETAILED DESCRIPTION OF THE PREFERRED EMBODIMENTS

According to one embodiment of the present invention, via connections that allow access to the bit lines or source lines of a 3-dimensional array of HNOR memory strings from both an interconnection conductor layer above the 3-dimensional array and an interconnection conductor layer beneath the 3-dimensional array are provided. In some embodiments, the interconnection conductor layer under the 3-dimensional array provides connections to buried contacts for accessing the circuitry for HNOR memory string operation in the underlying planar surface of a semiconductor substrate. The via connections of the present invention achieves its connectivity functions without requiring additional real estate or conductor resources in the interconnection conductor layers.

Figure 2A:
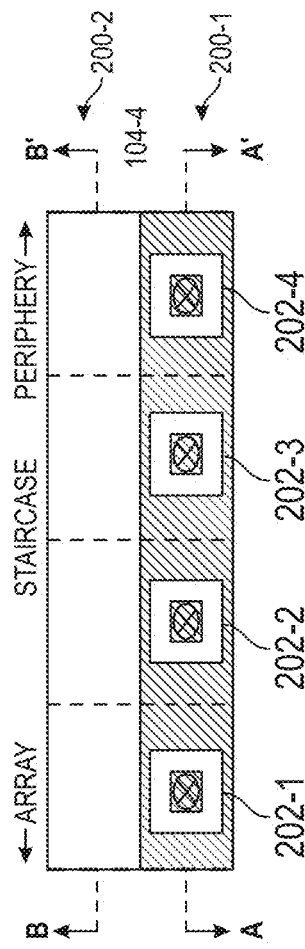
FIG. 2(a) is a top view of a staircase portion at an interconnect conductor layer above a 3-dimensional array of HNOR memory strings, showing via connections 202-1 to 202-4, in accordance with one embodiment of the present invention; merely for comparison purpose, FIG. 2(a) also shows an area from which via connections 104-1 to 104-4 of FIG. 1 are eliminated.
Figures 1, 3A:
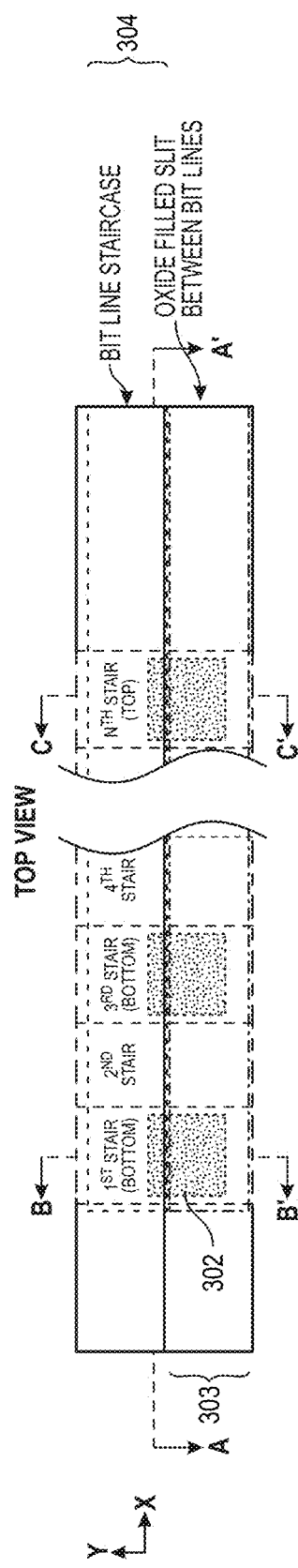
FIGS. 3(a)-1, 3(a)-2, 3(a)-3, 3(b), 3(c), 3(d), 3(e) and 3(f) illustrate a process for providing via connections between the bit lines in staircase structure 304 and (i) the circuitry at or on the planar surface of the semiconductor substrate and (ii) conductors at an interconnection conductor layer above the 3-dimensional array, in accordance with one embodiment of the present invention.

FIG. 2(a) is a top view of a staircase portion at an interconnect conductor layer above a 3-dimensional array of HNOR memory strings, showing via connections 202-1 to 202-4, in accordance with one embodiment of the present invention. Merely for comparison purpose, FIG. 2(a) also shows an area from which via connections 104-1 to 104-4 of FIG. 1 are eliminated. Of course, as demonstrated below, as via connections 104-1 to 104-4 are no longer required, this area need not be provided in any implementation.

Figure 1A:
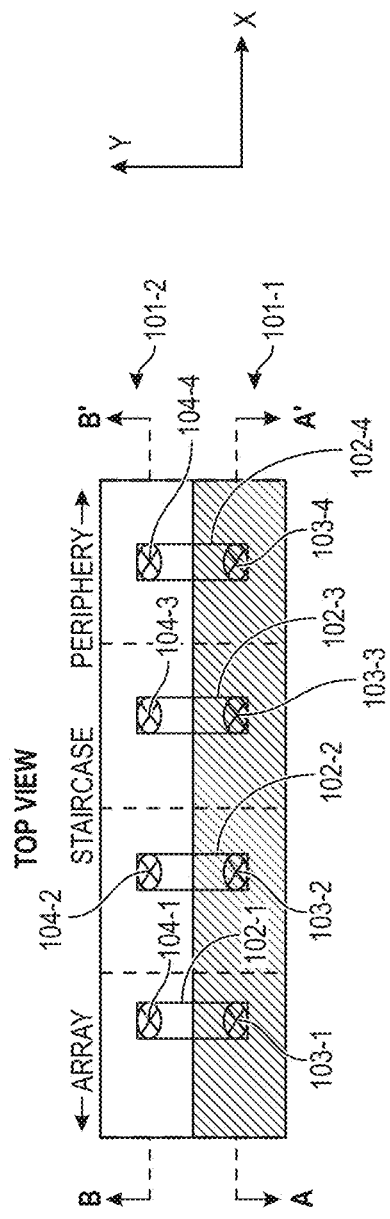
FIG. 1(a) shows a top view of a staircase portion at an interconnect conductor layer above a 3-dimensional array of HNOR memory strings of the type disclosed in the Copending Application.
Figure 1B:
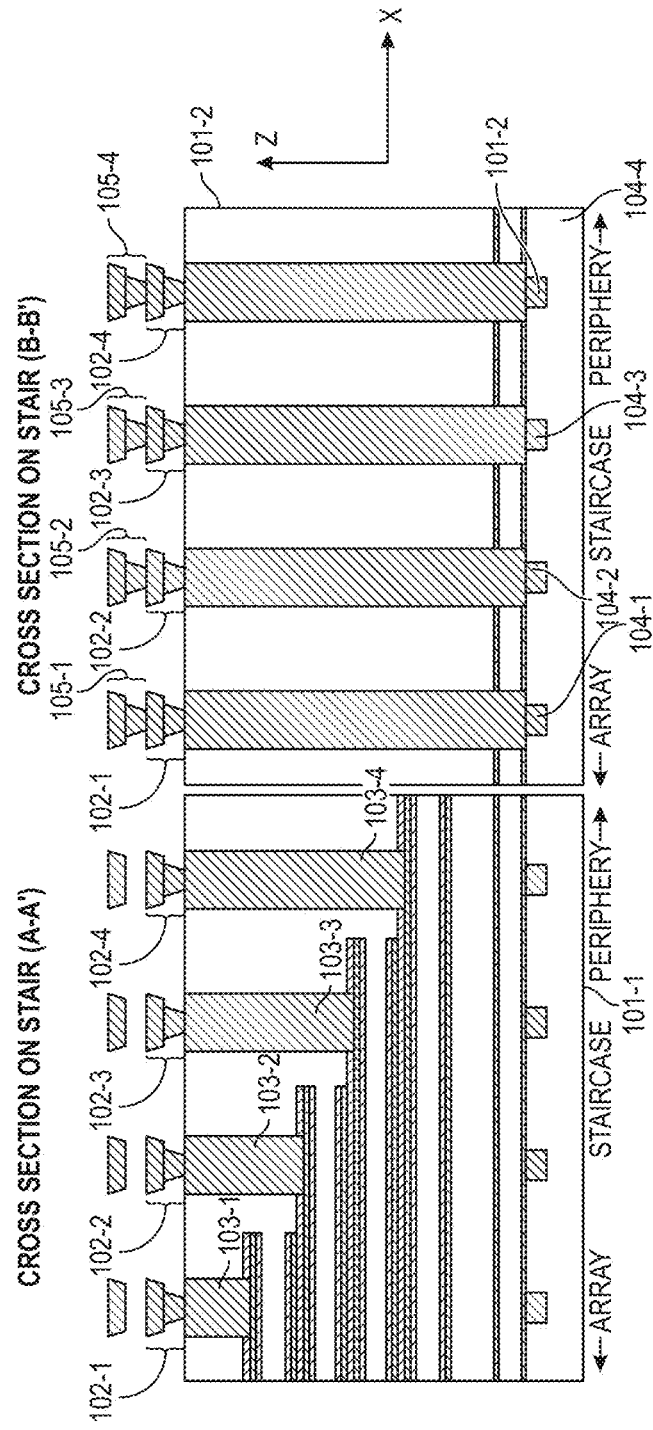
FIG. 1(b) shows cross-sections 101-1 and 101-2, which are X-Z plane cross sections along lines A-A' and B-B' annotated on FIG. 1(a).
Figure 2B:
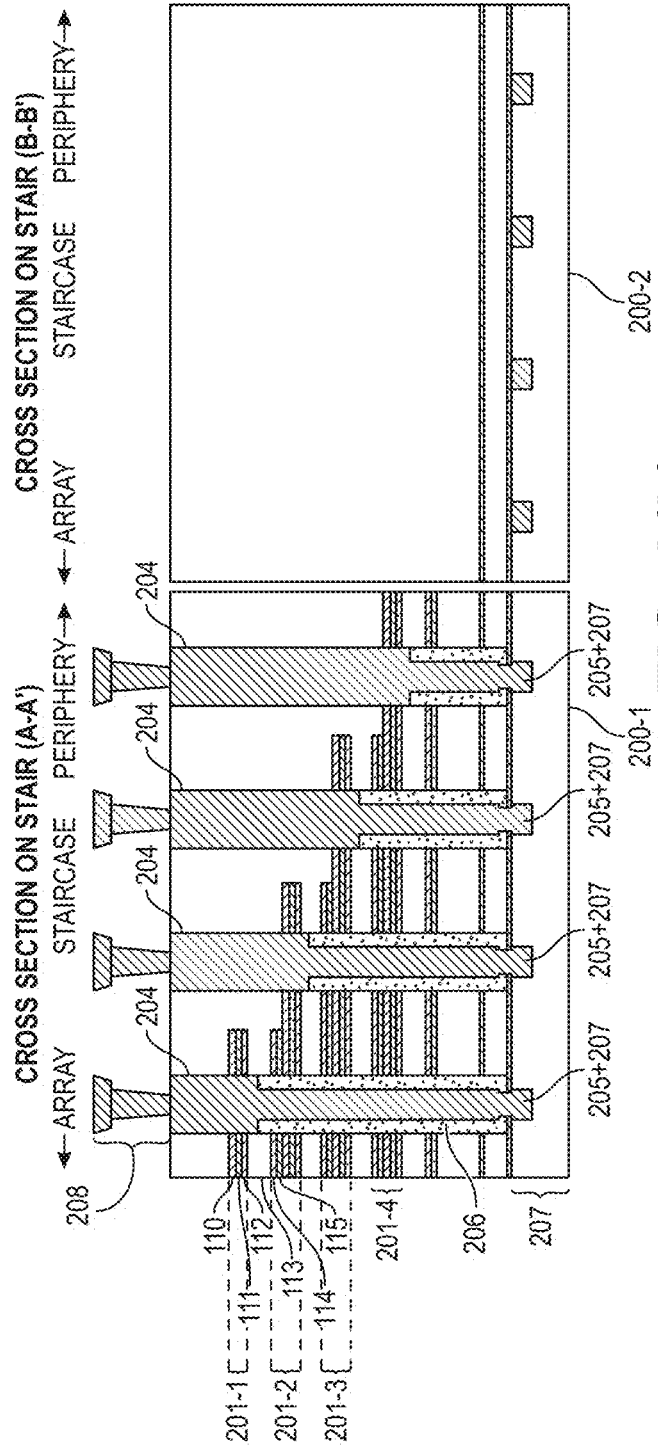
FIG. 2(b) shows cross-sections 200-1 and 200-2, which are X-Z planes along lines A-A' and B-B' of FIG. 2(a), respectively, in accordance with one embodiment of the present invention; line A-A' cuts across via connections 202-1 to 202-4.

FIG. 2(b) shows cross-sections 200-1 and 200-2, which are X-Z planes along lines A-A' and B-B' of FIG. 2(a), respectively, in accordance with one embodiment of the present invention. Line A-A' cuts across via connections 202-1 to 202-4. Via connections 202-1 to 202-4 provide substantially the same functions as the collection of first type of via connections 101-1 to 101-4, the second type of via connections 103-1 to 103-4, and conductors 102-1 to 102-4 connecting between the first and second types of via connections, as shown in FIGS. 1(a) and 1(b), so that via connections 202-1 to 202-4 eliminate the need for the silicon real estate of via connections 104-1 to 104-4 and the requirement for conductors 102-1 to 102-4. For this reason, cross-section 200-2 shows that the area previously occupied by via connections 104-1 to 104-4 are no longer required. In addition, via connections 105-1 to 105-4 of FIG. 1(b)—which route signals from via connections 104-1 and 104-4, respectively, to other circuitry (e.g., circuitry at the periphery, such as an interface to an external circuit)—can now be performed by the via connections and conductors associated with interconnection conductor layer 208.

Cross-section 200-1 of FIG. 2(b) shows steps 201-1 and 201-4, each step extending from the array portion of the 3-dimensional array of HNOR memory strings and comprising: (i) isolation layer (e.g., 30-nm thick silicon oxycarbon (SiOC)) 110, drain conductor layer (e.g., a 40-nm thick metal layer) 111, drain region (e.g., 30-nm thick n$^+$ polysilicon) 112, drain-source separation layer (e.g., 100-nm thick silicon oxide) 113, source region (e.g., 30-nm thick n$^+$ polysilicon) 114, and source conductor layer (e.g., a 40-nm thick metal layer) 115. Isolation layer 110 provides electrical isolation between adjacent steps. The extensions of drain regions 112 and source regions 114 into the staircase portion of the 3-dimension array serve as the bit lines and source lines, respectively. Drain conductor layer 111 and source conductor layer 115 are optional electrically conducting layers provided to reduce the resistances in the common bit line and the common source line, respectively. In some embodiments, drain conductor layer 111 and source conductor layer 115 may be formed using a metal replacement step that replaces previously deposited sacrificial layers (e.g., silicon nitride layers). At the time via connections 202-1 to 202-4 are completely formed, the metal replacement step may or may not have occurred. Therefore, drain conductor layer 111 and source conductor layer 115 of FIG. 2 may be the sacrificial layers at the time via connections 202-1 to 202-4 are formed.

Figures 2, 3A:
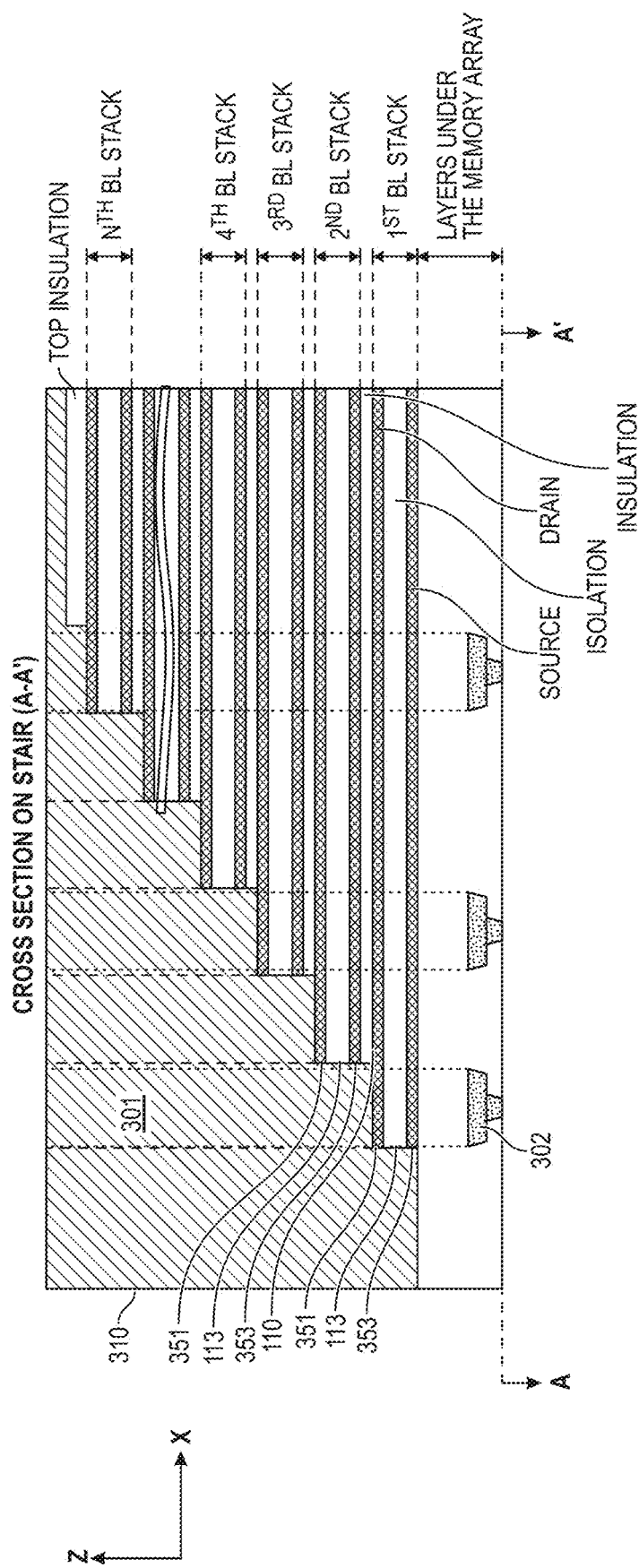

As shown in cross-section 200-1 of FIG. 2(b), via connections 202-1 to 202-4 are each provided as a conductive pillar that extends from interconnection conductor layer 208 above the 3-dimensional array to interconnection conductor layer 207 beneath the 3-dimensional array. Each conductive pillar of FIG. 2 is shown including (i) first portion 204, which extends from interconnection conductor layer 208 into drain-source separation layer 113 in its step of the staircase structure, and (ii) second portion 205, which extends from drain-source separation layer 113 to interconnection conductor layer 207 beneath the 3-dimensional array. In the embodiment shown in FIG. 2, first portion 204 of the conductive pillar contacts its bit line along its side walls. Second portion 205 of the conductive pillar is electrically isolated from the conductive layers of the other steps along its length by oxide spacer layer 206. For example, as shown in FIG. 2(b), the conductive pillar of via connection 202-1 contacts the bit line of step 201-1 and is electrically insulated from the conductive layers of steps 202-2, 202-3 and 202-4 by oxide spacer layer 206. In some embodiments, during the metal replacement step, the conductive pillars of via connections 202-1 to 202-4 serve as a brace to stabilize the staircase structure, contributing to preventing bending due to the sacrificial material being vacated from drain conductor layer 111 and source conductor layer 115.

In some embodiments, first portion 204 need not extend along the Z-direction into drain-source separation layer 113. It may be sufficient to extend along the Z-direction only as far as contacting drain conductor layer 111 or drain region 112.

FIGS. 3(a) to 3(f) illustrate a process for providing via connections between the bit lines in staircase structure 304 and (i) the circuitry at or on the planar surface of the semiconductor substrate and (ii) conductors at an interconnection conductor layer above the 3-dimensional array, in accordance with one embodiment of the present invention. Note that, while the principles illustrated in FIGS. 3(a) to 3(f) are applicable may be used to fabricate via connections of FIGS. 2(a) and 2(b) (e.g., via connections 202-1 to 202-4), which is included entirely within the footprint of the staircase portion of the 3-dimensional array, the embodiment illustrated in FIGS. 3(a)-3(f) provides via connections that overlap and extend beyond along the Y-direction a sidewall of the staircase structure, as discussed below.

Figures 3, 3A:
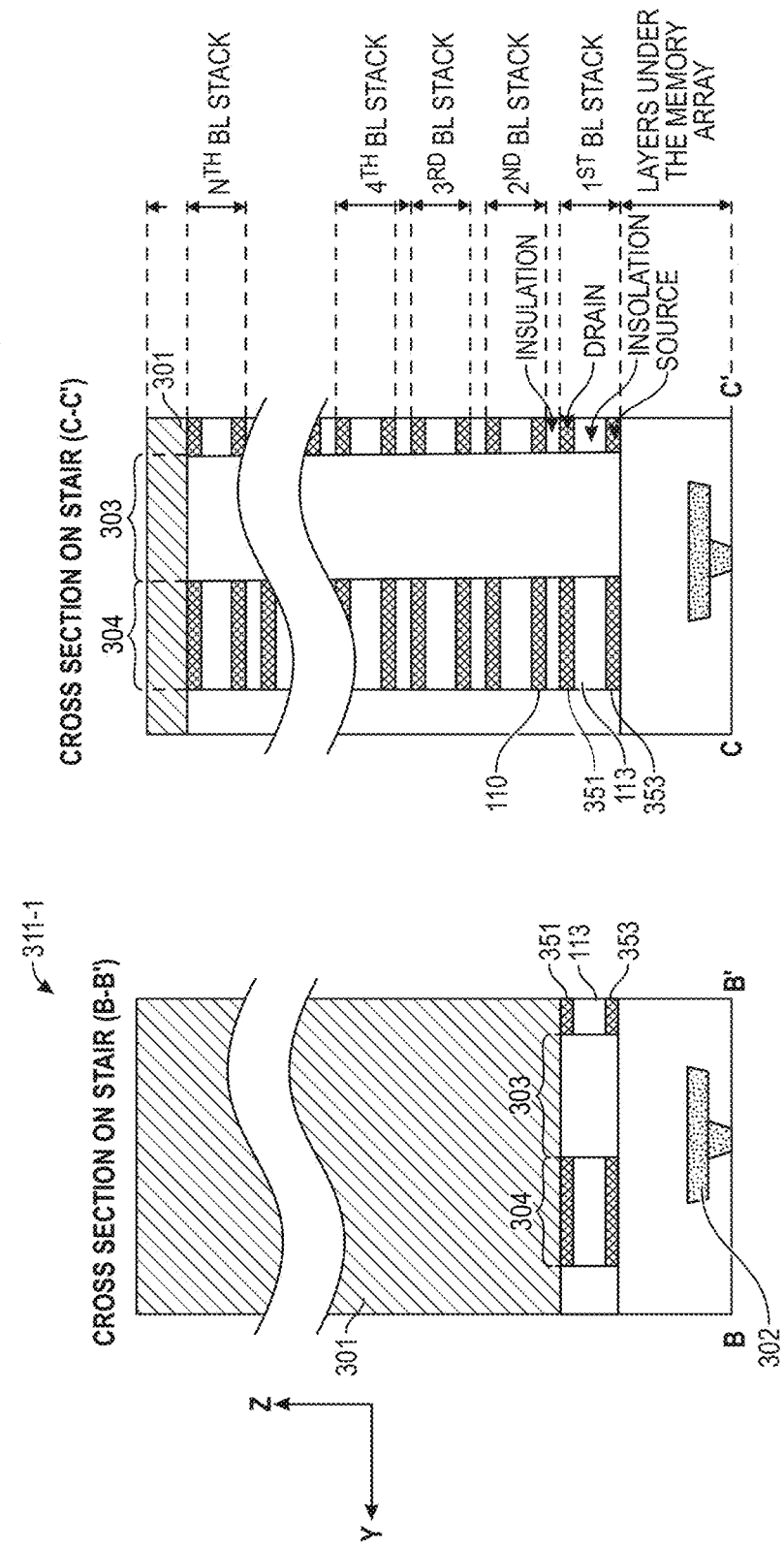
Figure 3B:
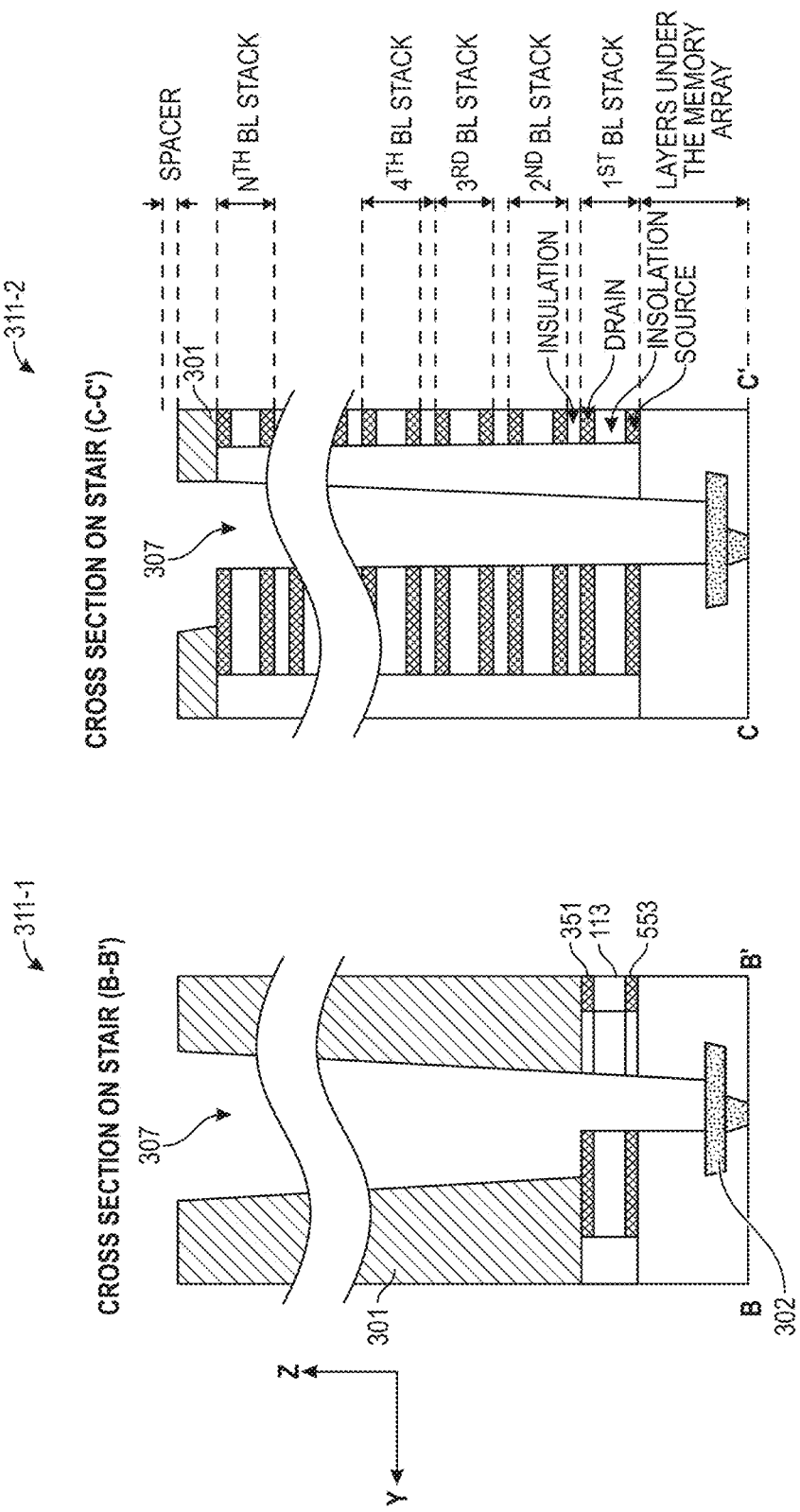
Figure 3C:
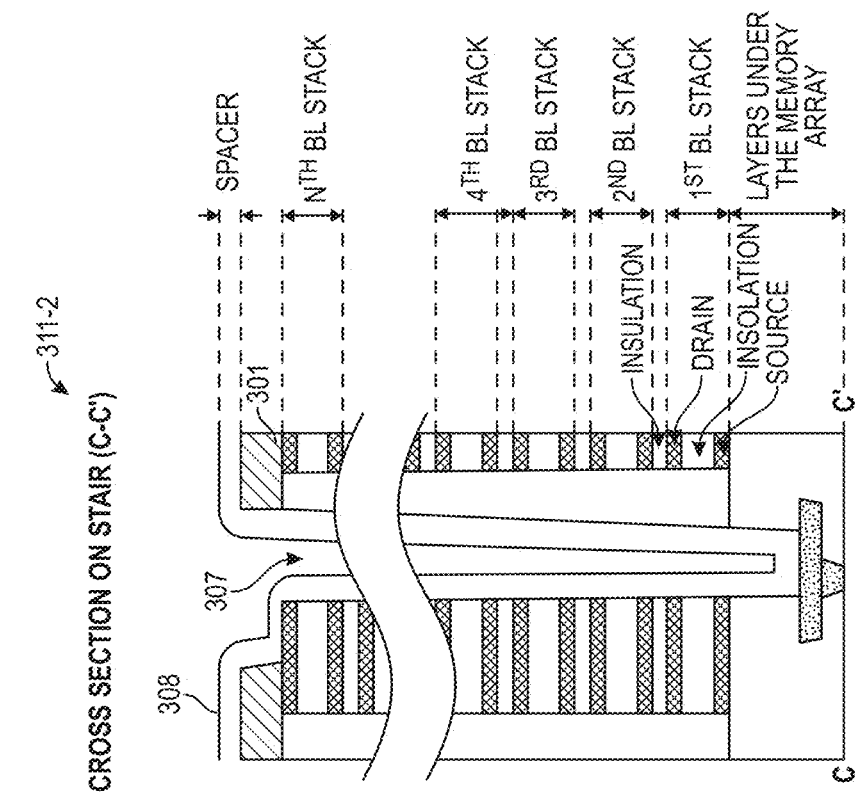
Figure 3C:
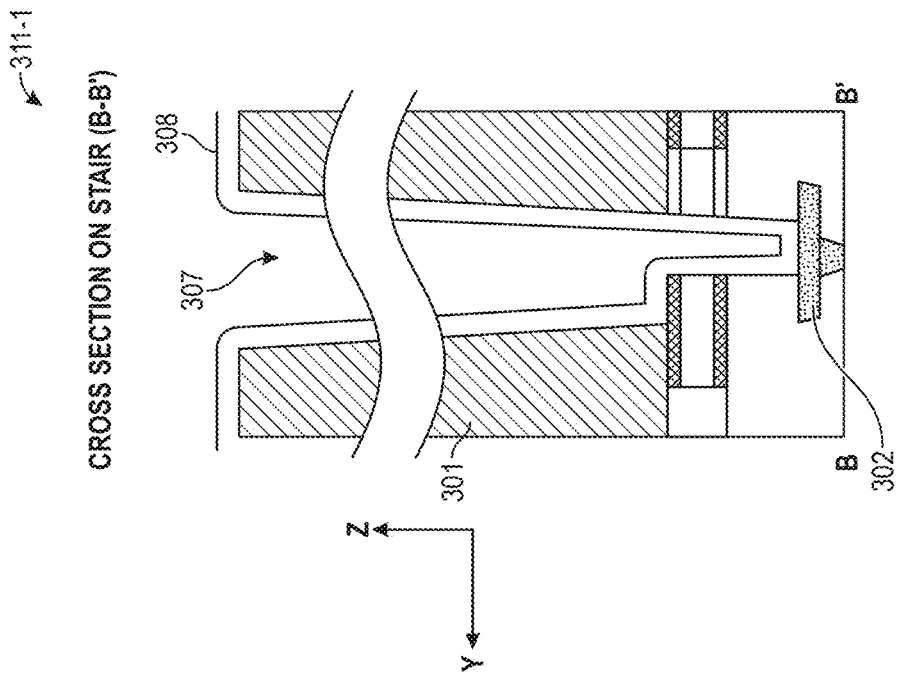

FIG. 3(a) includes (i) FIG. 3(a)-1, which is a top view (i.e., X-Y plane) of staircase structure 304 with an arbitrary number (n) of steps partially overlapping buried contacts 302 exposed to an interconnect conductor layer underneath the 3-dimensional array, (ii) FIG. 3(a)-2, which is cross-section (Z-X plane) 310 along line A-A' cutting both staircase structure 304 and buried contacts 302; and (iii) FIG. 3(a)-3, which includes cross-sections (Y-Z planes) 311-1 and 311-2, cutting through lines B-B' (i.e., at the first step of staircase structure 304) and C-C' (i.e., at the nth step of staircase structure 304) in FIG. 3(a)-1, respectively. In FIG. 3(a), buried contacts 302 are provided only underneath every other steps of staircase 304 in this side of the array portion of the 3-dimensional array. A similar staircase structure is provided on the opposite side of the array portion of the 3-dimensional array that provides buried contacts underneath the steps for which no buried contacts are provided in staircase 304.

Each of buried contacts 302 extends in the Y-direction beyond staircase structure 304 to overlap oxide-filled area 303 on one side of staircase structure 304. (Thus, the resulting via connections fabricated in the process of FIGS. 3(a)-3(f) overlap and extend beyond along the Y-direction a sidewall of staircase structure 304; see, e.g., FIG. 3(a)-1). In FIGS. 3(a)-1, 3(a)-2 and 3(a)-3, interposer oxide 301 fills the volume above the steps of staircase structure 304, the oxide in interposer oxide 301 may be the same oxide in oxide-filled area 303. For clarity, in FIGS. 3(a)-3(f), each step of staircase 304 are shown represented by drain layer 351, drain-source separation layer 113, source layer 353 and isolation layer 110. Drain layer 351 may be, for example, the combination of drain conductor layer 111 and drain region 112 of FIG. 2. Likewise, source layer 353 may be, for example, the combination of source conductor layer 115 and source region 114 of FIG. 2. FIG. 3(a) shows staircase structure 304 after its formation, an oxide fill step and a planarization step (e.g., by a chemical-mechanical polishing (CMP) step).

Thereafter, after a photo-lithographical patterning step, a contact via etch is performed, which removes interposer oxide 301 above the steps of staircase structure 304 and a part of oxide-filled area 303 to provide trenches 307. The resulting structure is illustrated in cross-sections 311-1 and 311-2 of FIG. 3(b).

Figure 3D:
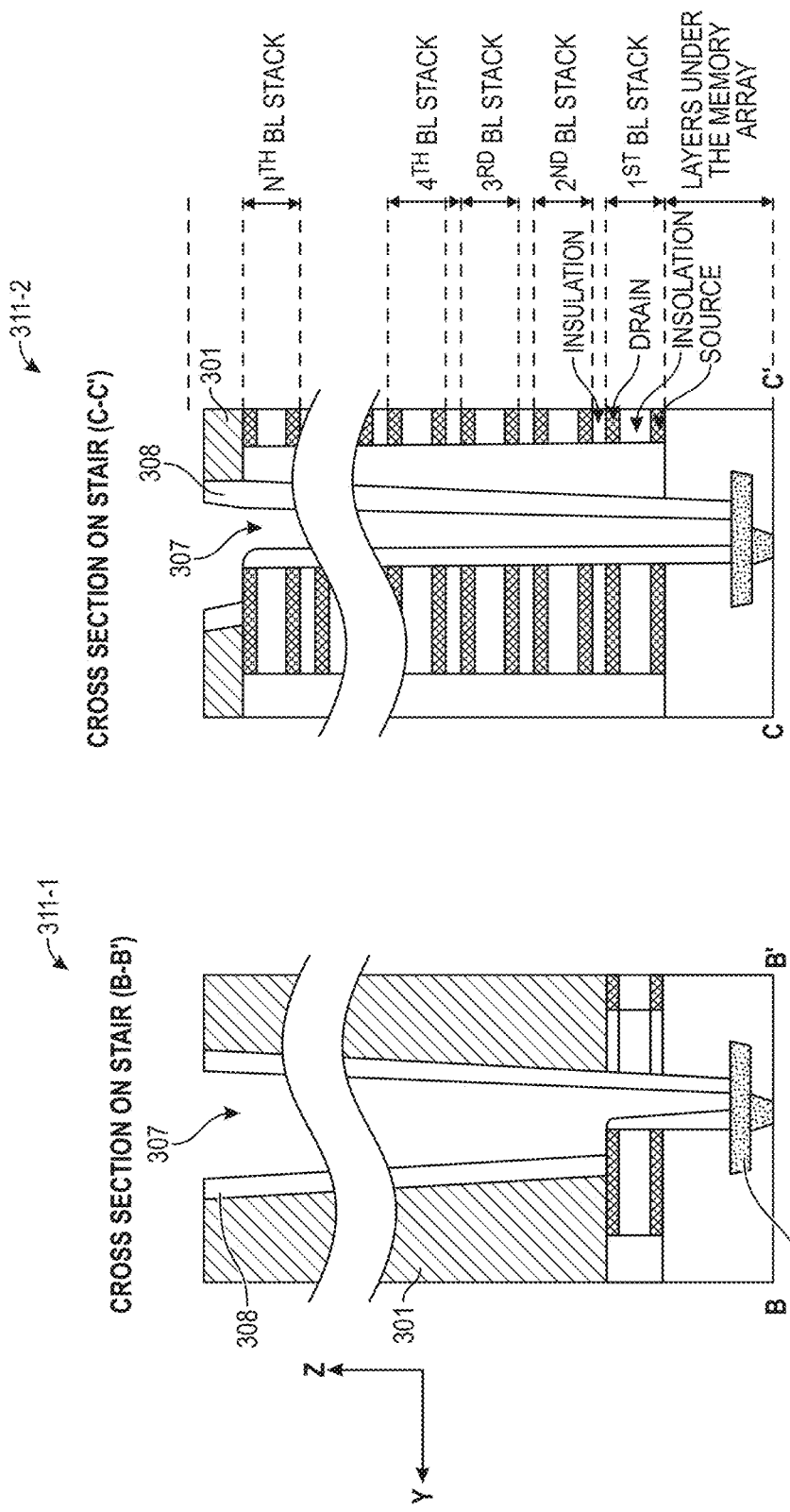

Thereafter, a spacer deposition step deposits oxide spacer layer 308 into trenches 307. The resulting structure is illustrated in cross-sections 311-1 and 311-2 of FIG. 3(c). Spacer oxide layer 308 is then anisotropically etched back from each of trenches 307 to expose the top of the step in each trench and buried contact 302 at the bottom of the trench. The resulting structure is illustrated in FIG. 3(d).

Figure 3E:
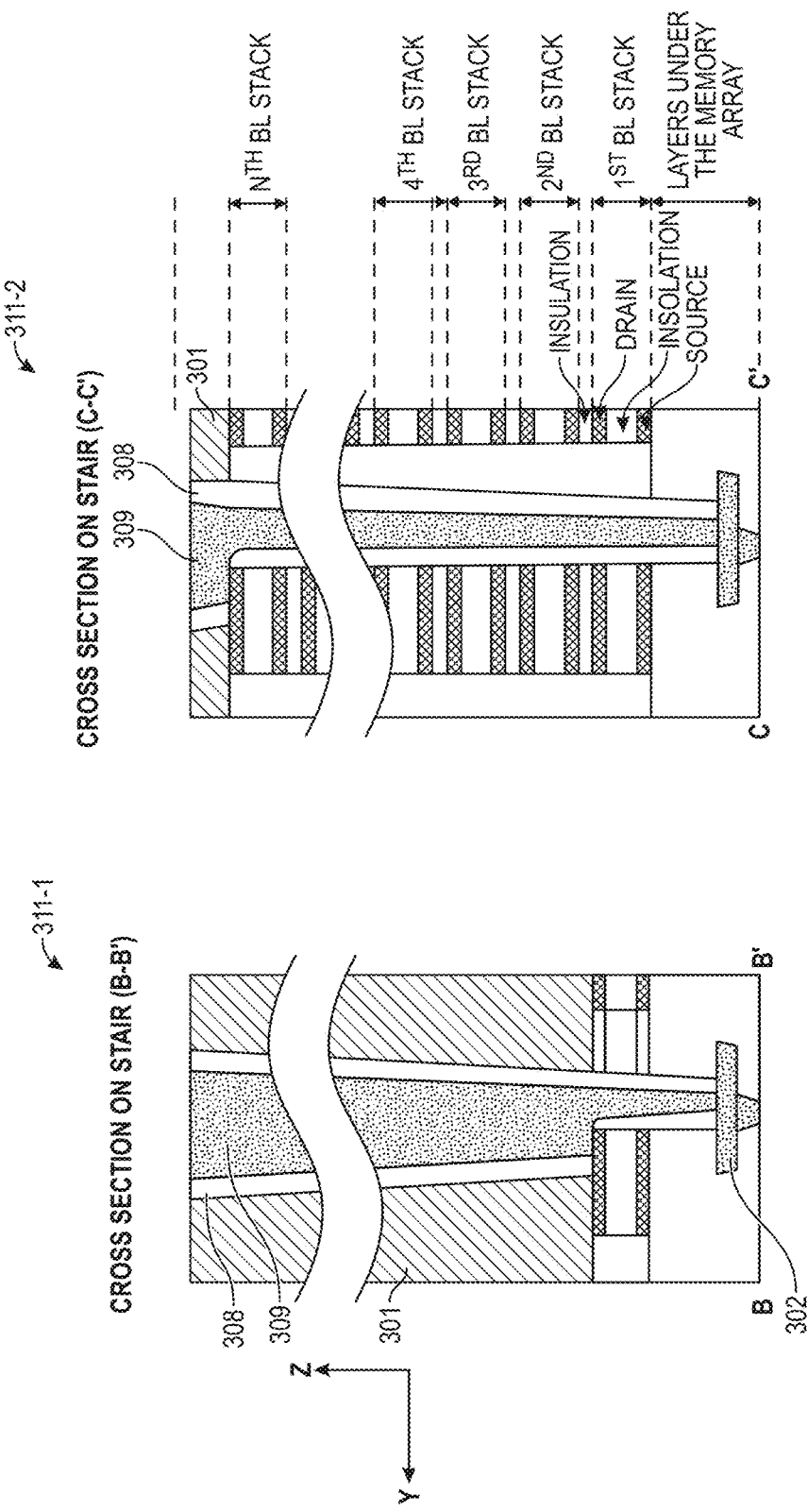

Thereafter, trenches 307 may be filled with conductor 309 (e.g., a titanium nitride (TiN) liner, followed by a tungsten (W) fill). A CMP step may planarize the surface of the resulting structure and may remove excess conductor from the surface of the resulting structure. The resulting structure is illustrated in FIG. 3(e).

Figure 3F:
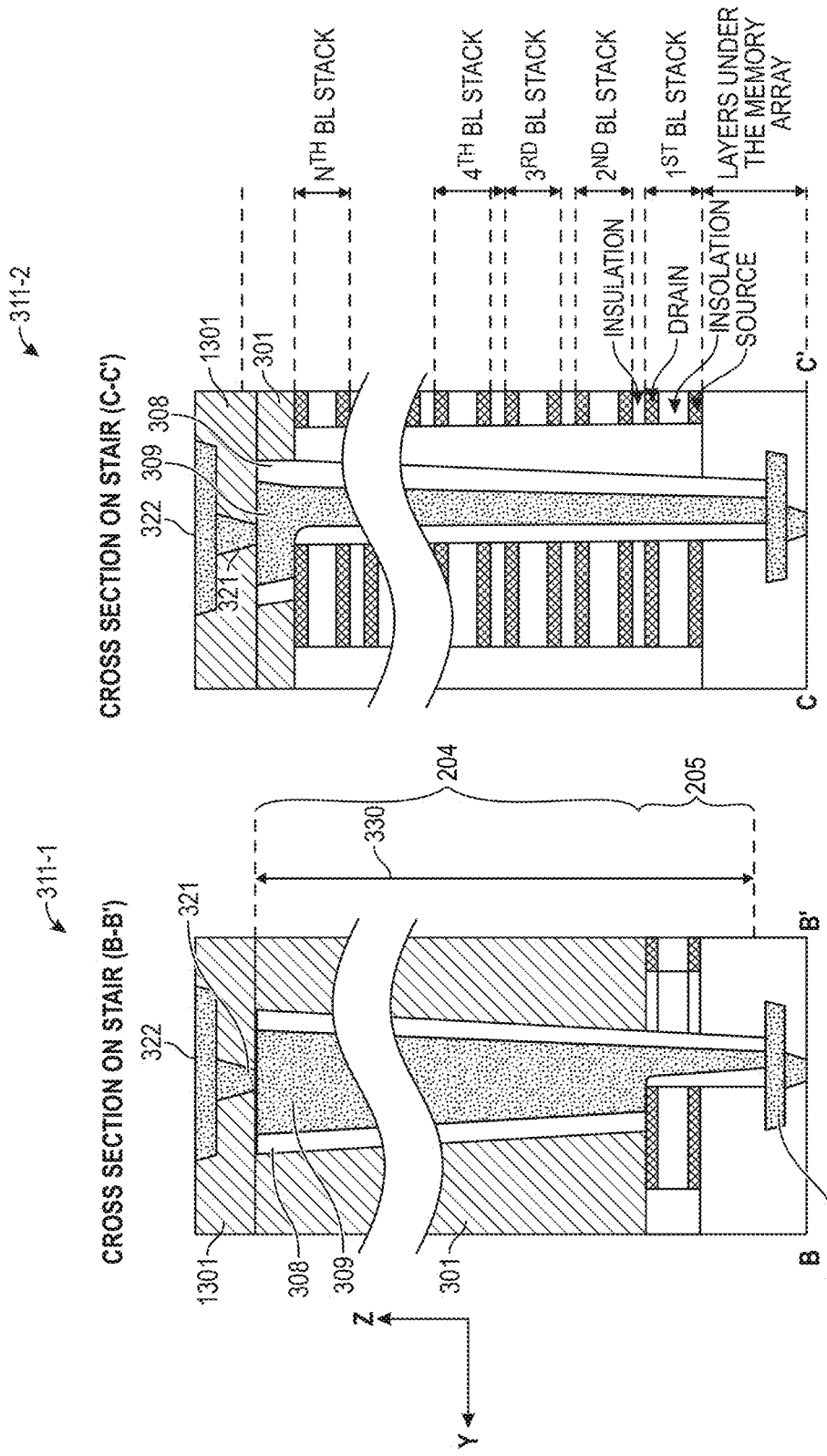

Thereafter, an addition layer of interposer oxide 1301 (e.g., SiO$_2$) is provided over the surface and conductor-filled vias (e.g., W) 321 are then provided in interposer oxide 1031 to allow access to conductor 309. Via connection 330 is deemed complete. The resulting structure is illustrated in FIG. 3(f). Indicated in FIG. 3(f) are the portions of the conductive pillar in via connection 330 that correspond to first portion 204 and second portion 205 of the conductive pillar in FIG. 2. Conductors in interconnection conductor layer 322 above the 3-dimensional array may then be used to route signals to via connection 330.

Figure 4:
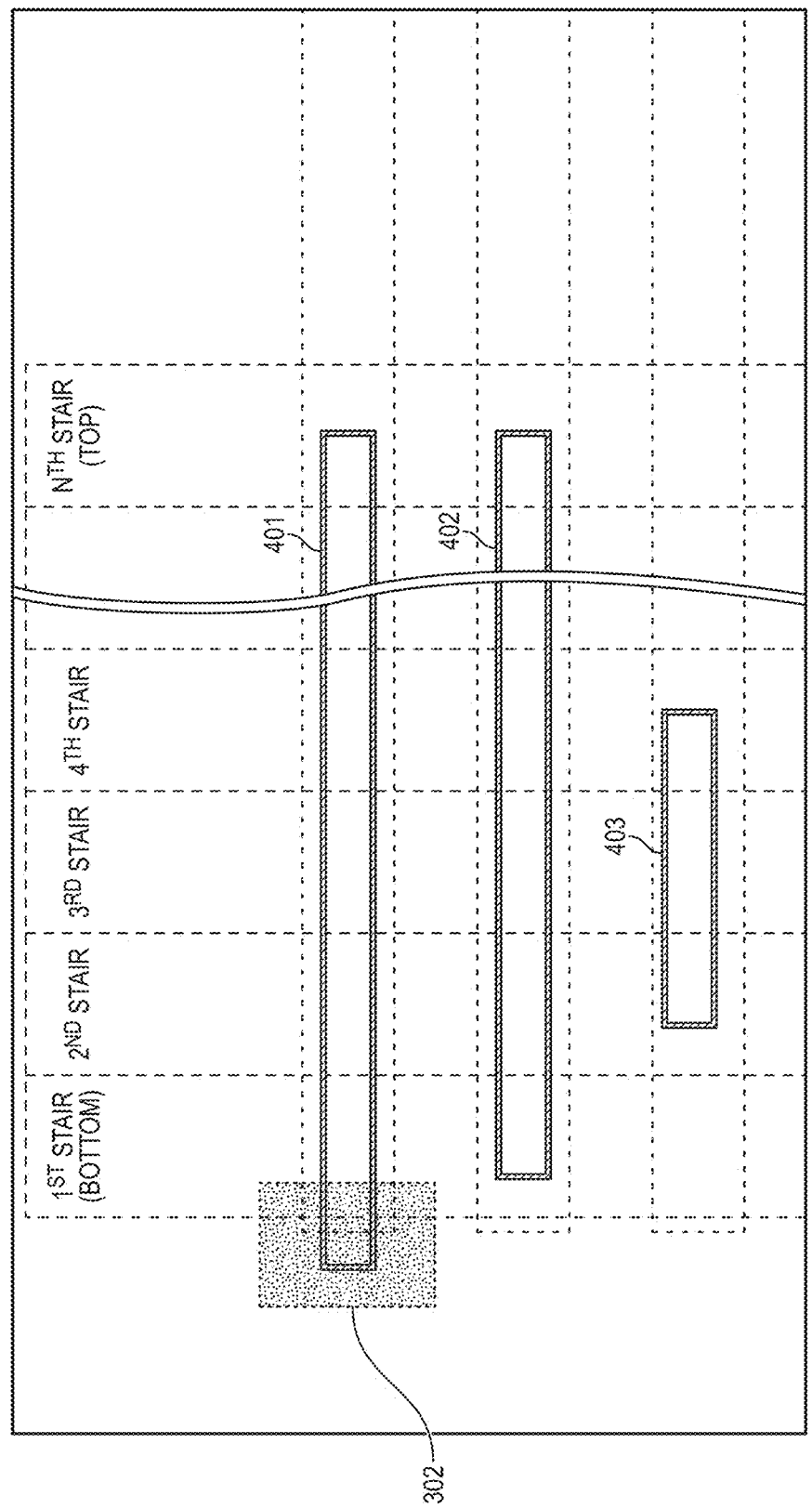
FIG. 4 shows slits 401, 402 and 403, where common via connections may be formed to connect, respectively, (i) source lines at all steps of the staircase structure to a conductor in an interconnection conductor layer under the 3-dimensional array, (ii) source lines at all steps of the staircase structure, without access to buried contact 302 in an interconnection conductor layer under the 3-dimensional array, and (iii) selective source lines, according to one embodiment of the present invention.

As disclosed in the Copending Application, the source lines of a 3-dimensional array may be biased to a common voltage supplied from one or more voltage sources in the circuitry at or on the planar surface of the semiconductor substrate. Alternatively, selected ones or all source lines may be tied together to allow, during a read, program or erase operation, the source lines to be pre-charged to a common voltage. The total capacitance of the tied source lines may sustain the pre-charged voltage in order to serve as a virtual voltage source (e.g., a virtual ground) during the read, program or erase operation. Thus, unlike the bit lines, via connections to the source line of each individual step of the staircase structure need not be provided. FIG. 4 shows slits 401, 402 and 403, where common via connections may be formed to connect, respectively, (i) source lines at all steps of the staircase structure to a conductor in an interconnection conductor layer under the 3-dimensional array, (ii) source lines at all steps of the staircase structure, without access to buried contact 302 in an interconnection conductor layer under the 3-dimensional array, and (iii) selective source lines, according to one embodiment of the present invention. Slit 401, 402 or 403 may span the steps of the staircase structure along the X-direction but separated in Y-positions from the via connections for the bit lines of the staircase structure.

FIGS. 5(a) to 5(e) illustrate a process for providing via connections to the source lines of a staircase structure, according to one embodiment of the present invention. Specifically, FIGS. 5(a) to 5(e) illustrate a process for forming a via connection for source lines of a staircase structure which is accessible from conductors in an interconnection layer above the 3-dimensional array and which connects source lines at all steps of the staircase structure to a conductor in an interconnection conductor layer under the 3-dimensional array (e.g., within slit 401).

Figure 5A:
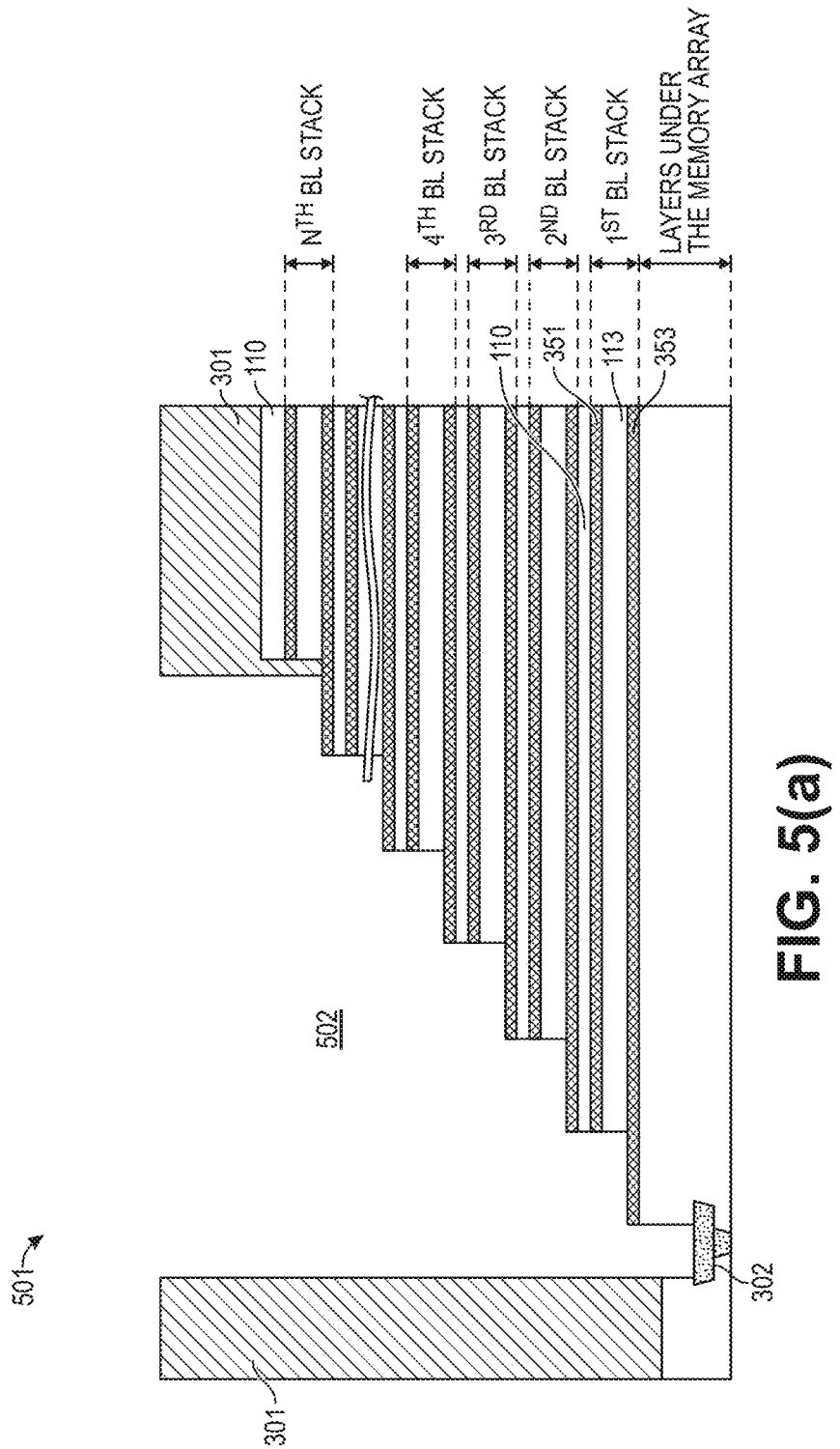
FIGS. 5(a), 5(b), 5(c), 5(d) and 5(e) illustrate a process for providing via connections to the source lines of a staircase structure, according to one embodiment of the present invention.

Initially, to form the via connection for the source lines, the drain layer and the drain-source separation layer of each step of the staircase structure (e.g., drain layer 351 and drain-source separation layer 113 at each step of staircase structure 304 of FIG. 3(a)) in the vicinity are removed in an etching step. Thereafter, the resulting structure is filled with an oxide (e.g., interposer oxide 301). A photo-lithographical patterning step is then performed on the oxide-filled staircase structure to pattern for the selected common source line via slit (e.g., slit 401 of FIG. 4), followed by a contact via etch. The resulting structure, staircase structure 501, is shown in FIG. 5(a). As shown in FIG. 5(a), trench 502 is formed by removing interposer oxide layer 301 from via slit 401, such that buried contact 302 and source layer 353 of each step of staircase structure 501 are exposed. (To facilitate cross reference, the layers of each step of staircase structure 501 are labeled by the corresponding layers at each step of corresponding staircase structure 304 of FIG. 3—i.e., each step of staircase structure 501 comprises isolation layer 110, drain layer 351, drain-source separation layer 113 and source layer 353.)

Figure 5B:
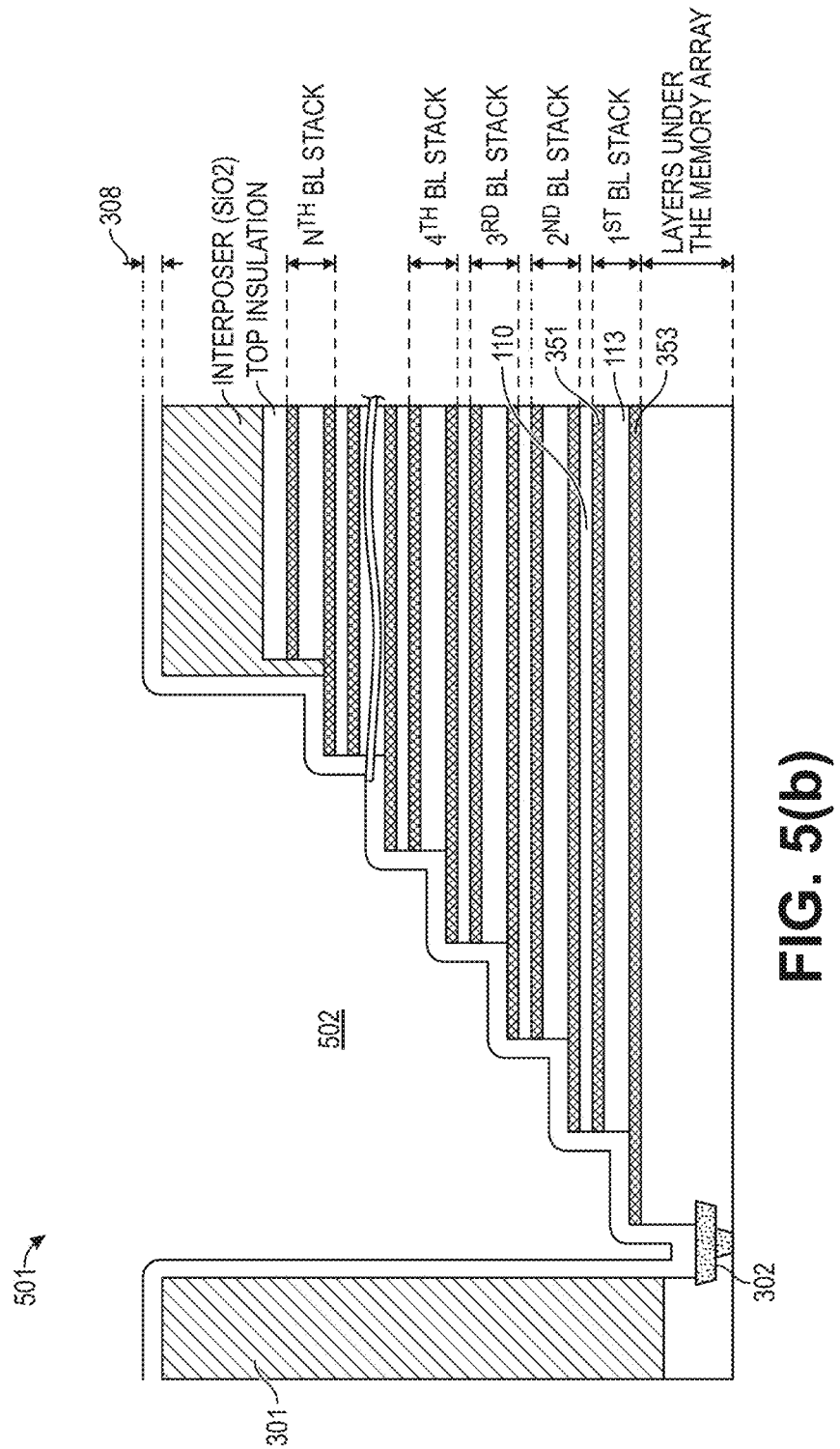

A spacer deposition step then deposits oxide spacer layer 308 into trench 502. This spacer deposition step may be carried out concurrently with the spacer deposition step of FIG. 3(c) that is carried out for the bit line via connections. The resulting structure is illustrated in FIG. 5(b).

Figure 5C:
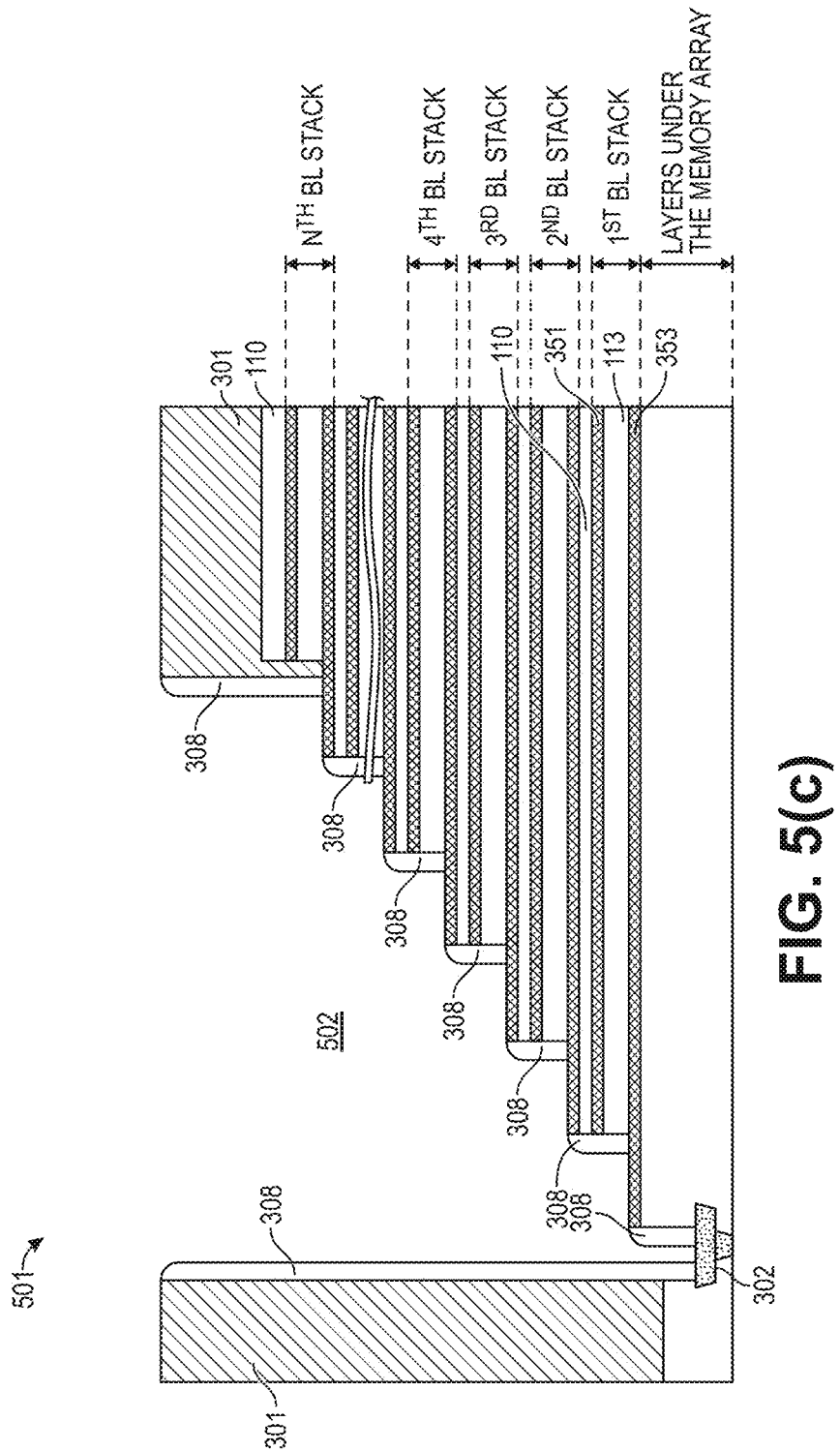

Spacer oxide layer 308 is then anisotropically etched back in trench 502 to expose source layer 353 on each step and buried contact 302 at the bottom of trench 502. This spacer anisotropical etch step may be carried out concurrently with the spacer anisotropical etch step of FIG. 3(d) that is carried out for the bit line via connections. The resulting structure is illustrated in FIG. 5(c).

Figure 5D:
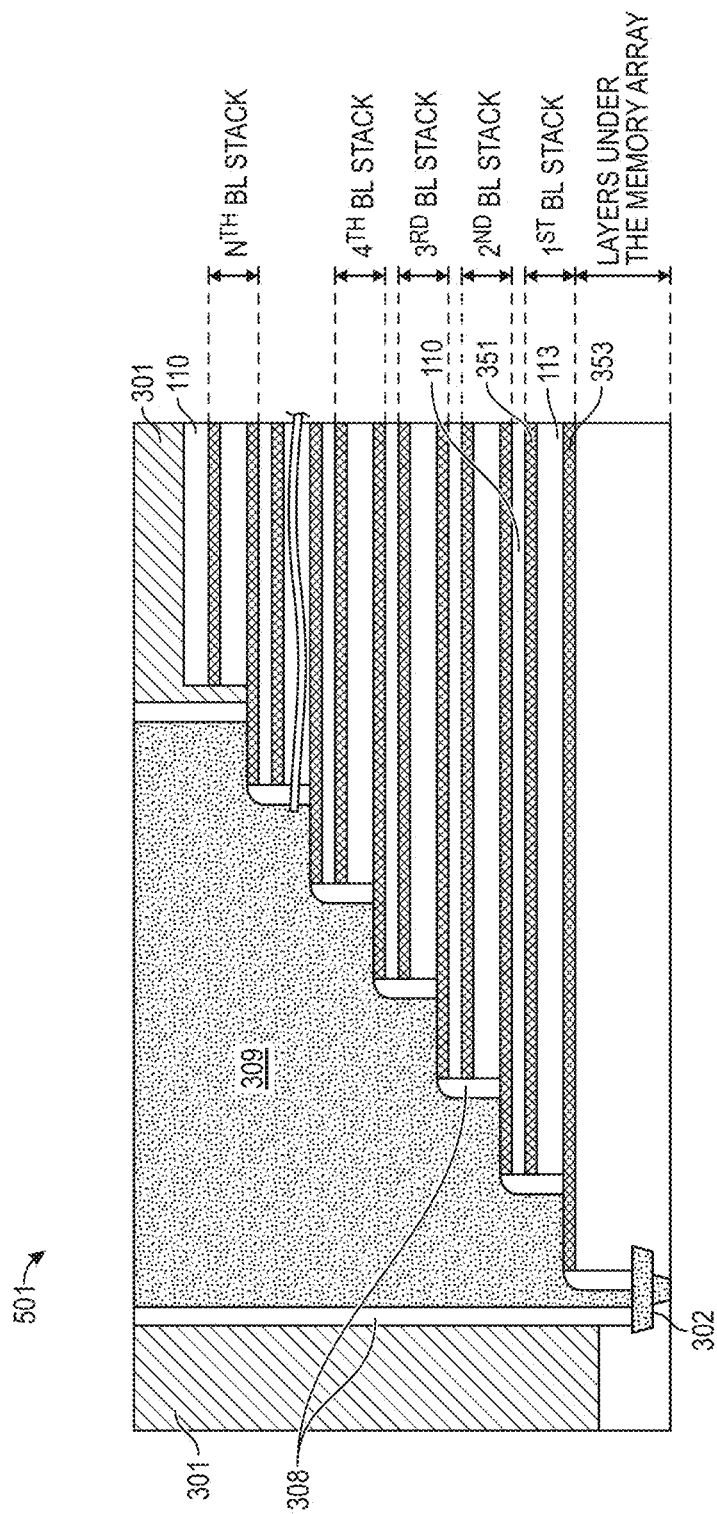

Thereafter, trench 502 may be filled with conductor 309 (e.g., a titanium nitride (TiN) liner, followed by a tungsten (W) fill). A CMP step may be applied to planarize the surface of the resulting structure and to remove excess conductor from the surface of the resulting structure. The conductor fill and CMP steps may be carried out concurrently with the conductor fill and CMP steps of FIG. 3(e) that is carried out for the bit line via connections. The resulting structure is illustrated in FIG. 5(d).

Figure 5E:
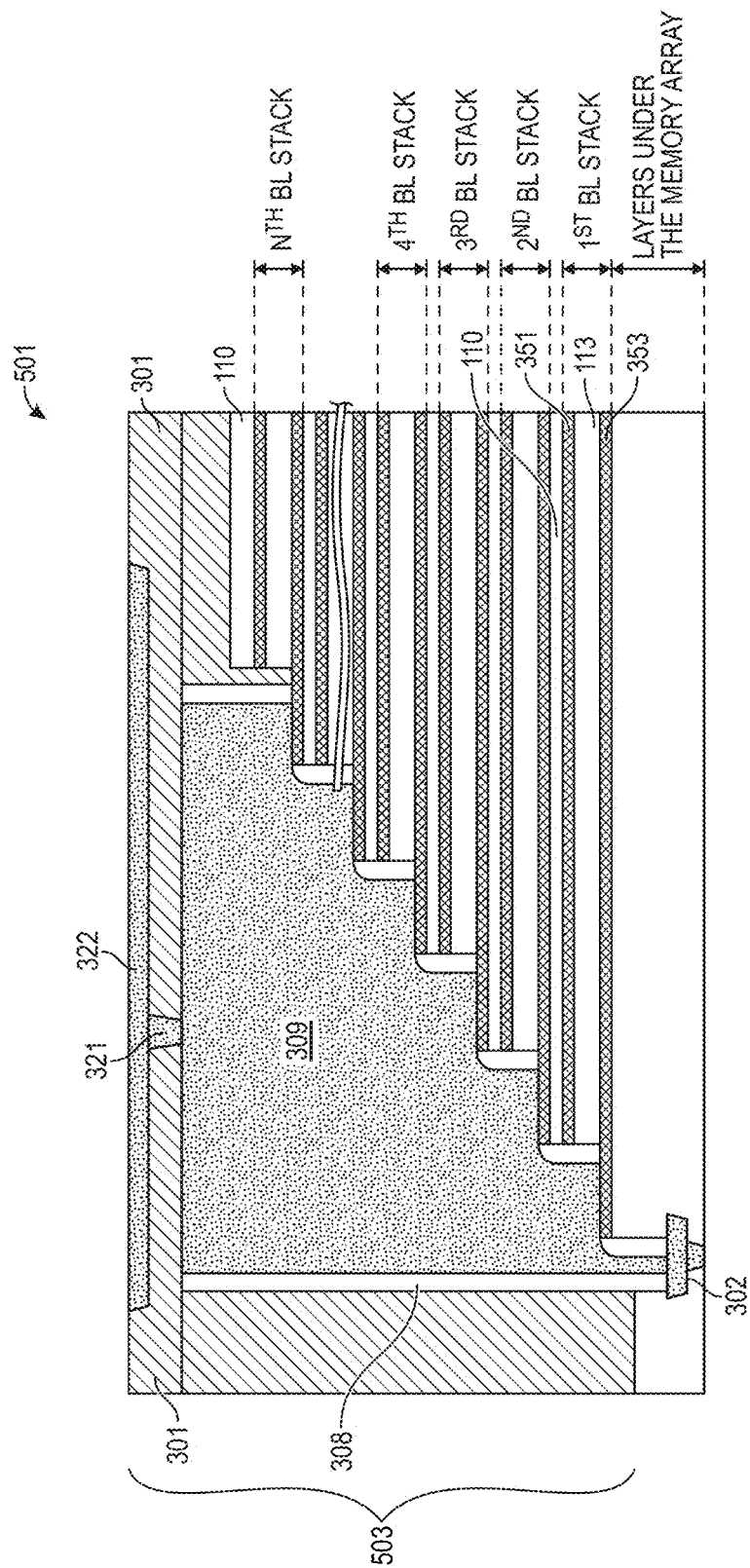

Thereafter, an addition layer of interposer oxide 301 (e.g., SiO$_2$) is provided over the surface and conductor-filled (e.g., W) via 321 is then provided in interposer oxide 301 to allow access to conductor 309. Via connection 503 is deemed complete. One or more conductors in interconnection conductor layer 322 above the 3-dimensional array may then be used to route signals to via connection 503. The interposer oxide deposition, via formation, and formation of interconnection conductor layer 322 may be carried out concurrently with the corresponding steps of FIG. 3(f) that is carried out for the bit line via connections. The resulting structure is illustrated in FIG. 5(e).

The above-detailed description is provided to illustrate specific embodiments of the present invention and is not intended to be limiting. Numerous modifications and variations within the scope of the present invention are possible. The present invention is set forth in the accompanying claims.

We claim:

1. A conductor-filled via formed between an interconnection conductor layer and two or more steps of a staircase structure in conjunction with a 3-dimensional array of memory cells formed above a planar surface of a semiconductor substrate, wherein (i) the staircase structure comprises a plurality of steps, (ii) each step comprises a plurality of layers, one on top of another, including, a source line layer at the top of each of the two or more steps of the staircase structure and an additional conductive layer; and (iii) the conductor-filled via is formed inside a spacer insulator that exposes the source line layers at the top of each of the two or more steps of the staircase structure and which insulates the conductor-filled via from the additional conductive layers in the two or more steps of the staircase structure.

2. The conductor-filled via of claim 1, wherein the conductor-filled via also electrically contacts one or more buried contacts between the planar surface of a semiconductor substrate and the staircase structure.

3. The conductor-filled via of claim 2, wherein circuitry for memory cell operations is formed at or on the planar surface of the semiconductor substrate, and wherein the buried contacts are provided to connect to the circuitry.

4. The conductor-filled via of claim 1, wherein the spacer insulator comprises silicon oxide.

5. The conductor-filled via of claim 1, wherein the 3-dimensional array of memory cells comprises a 3-dimensional array of storage transistors organized as horizontal NOR memory strings.

6. The conductor-filled via of claim 1, wherein the conductor-filled via comprises tungsten provided over a titanium nitride liner layer.

7. The conductor-filled via of claim 1, wherein the plurality of layers further comprises a silicon oxycarbide layer.

8. The conductor-filled via of claim 1, wherein each source line layer comprises polysilicon.

9. The conductor-filled via of claim 8, wherein each source line layer further comprises a metal layer adjacent the polysilicon.

* * * * *